United States Patent [19]
Denham

[11] Patent Number: 5,731,733
[45] Date of Patent: Mar. 24, 1998

[54] STATIC, LOW CURRENT SENSING CIRCUIT FOR SENSING THE STATE OF A FUSE DEVICE

[75] Inventor: Martin S. Denham, Yamhill, Oreg.

[73] Assignee: Intel Corporation, Santa Clara, Calif.

[21] Appl. No.: 537,142

[22] Filed: Sep. 29, 1995

[51] Int. Cl.$^6$ .................... G11C 17/16; G01R 31/02
[52] U.S. Cl. .................... 327/525; 327/546; 327/541; 365/225.7; 326/38
[58] Field of Search .................... 327/525, 50, 51, 327/543, 538, 530, 546, 545, 541, 20; 365/225.7; 323/315; 326/38

[56] References Cited

U.S. PATENT DOCUMENTS

| | | | |
|---|---|---|---|
| 4,608,530 | 8/1986 | Bacrania | 327/525 |
| 4,698,589 | 10/1987 | Blankenship et al. | 365/96 |
| 4,730,129 | 3/1988 | Kunitoki et al. | 327/525 |
| 4,837,520 | 6/1989 | Golke et al. | 326/16 |
| 5,140,554 | 8/1992 | Schreck et al. | 365/225.7 |
| 5,334,880 | 8/1994 | Abadeer et al. | 327/526 |
| 5,384,727 | 1/1995 | Moyal et al. | 365/225.7 |
| 5,384,746 | 1/1995 | Giolma | 365/225.7 |
| 5,418,487 | 5/1995 | Armstrong, II | 327/525 |

*Primary Examiner*—Timothy P. Callahan
*Assistant Examiner*—Terry L. Englund
*Attorney, Agent, or Firm*—Cynthia Thomas Faatz

[57] ABSTRACT

A fuse sensing circuit comprises a first branch includes a first sensing transistor, and a fuse coupled to the source of the first sensing transistor. The fuse has a programmed state characterized by a first resistance, and an unprogrammed state in which the fuse has a second resistance. A second reference branch is coupled to the first branch in a current mirror configuration and includes a second sensing transistor, and a predetermined reference resistance coupled to the source of the second sensing transistor. The reference resistance is matched to the fuse device in an un-programmed state. The potential at an output node coupled to the first sensing transistor is determined by the state of the fuse device, such that the potential of the output node is within a first voltage range if the fuse device is programmed, and a second voltage range if the fuse device is un-programmed.

24 Claims, 6 Drawing Sheets

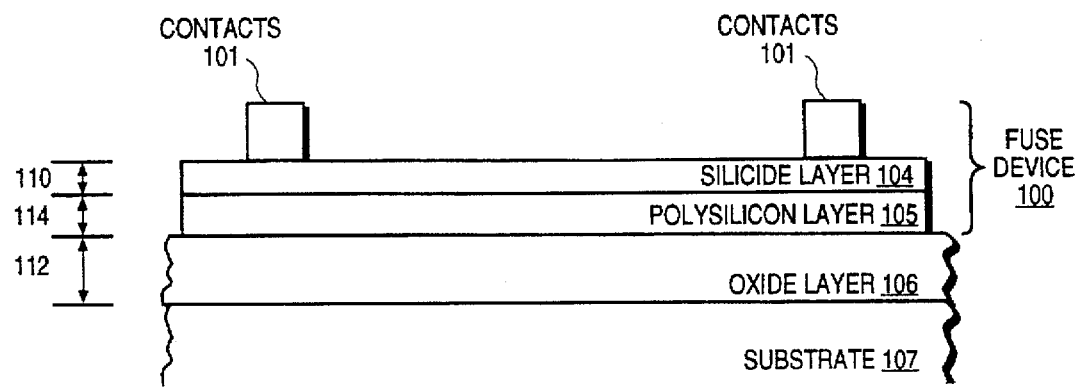
FIG. 1A (SIDE VIEW)
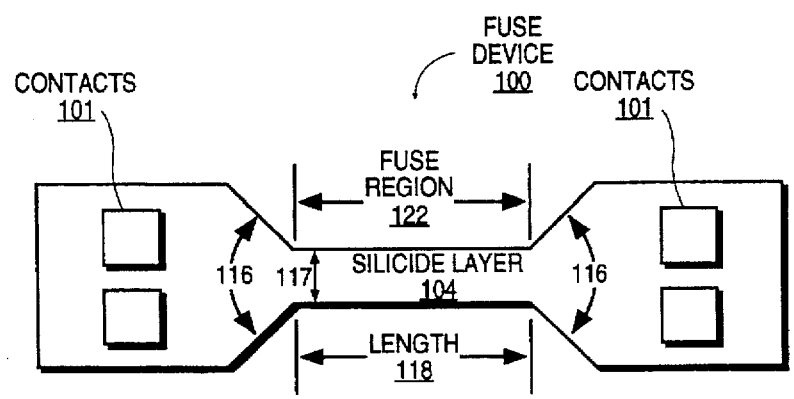
FIG. 1B (TOP VIEW)

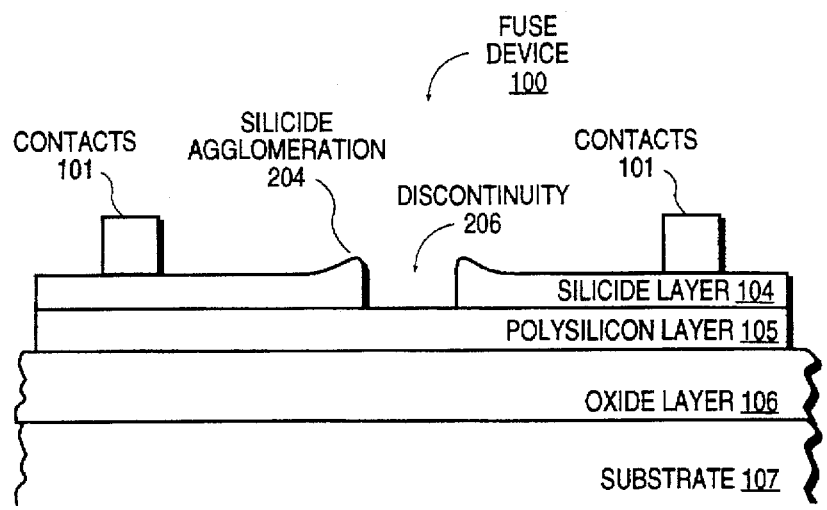
FIG. 2A (PROGRAMMED FUSE)
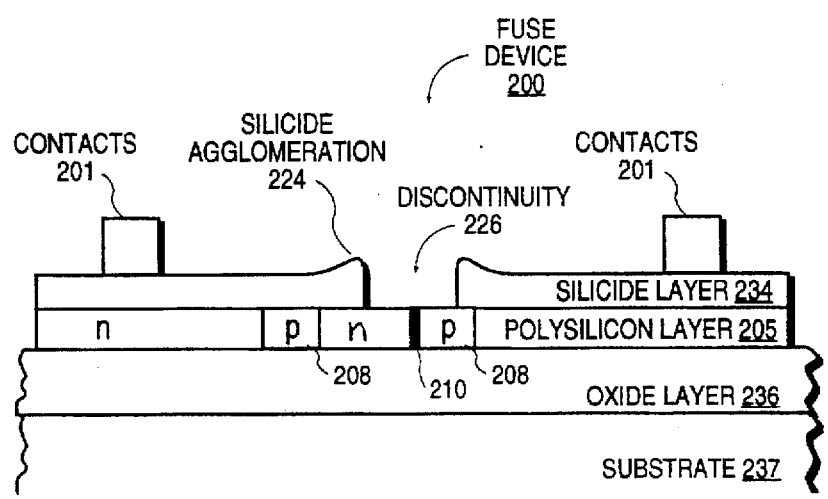
FIG. 2B (PROGRAMMED FUSE)

STATIC, LOW CURRENT SENSING CIRCUIT FOR SENSING THE STATE OF A FUSE DEVICE

RELATED APPLICATION

This application is related to U.S. patent application Ser. No. 08/537,283 entitled, "A Silicide Agglomeration Fuse Device", filed Sep. 29, 1995 (Attorney's Docket No. 42390. P3064).

FIELD OF THE INVENTION

The invention relates to the field of integrated circuit devices and more particularly, to circuits for sensing the state of a fuse device.

BACKGROUND OF THE INVENTION

In integrated circuits including CMOS integrated circuits, it is often desirable to be able to permanently store information, or to form permanent connections on the integrated circuit after it is manufactured. Fuses or devices forming fusible links are frequently used for this purpose. Fuses can be used to program redundant elements to replace identical defective elements, for example. Fuses can also be used to store die identification or other such information, or to adjust the speed of a circuit by adjusting the resistance of the current path.

Fuse devices are selectively programmed to provide the capabilities described above. Once the desired state of fuses on an integrated circuit device is determined, and the appropriate fuse or fuses are programmed, it is useful to be able to verify and/or sense the state of the fuses. In most cases, a sensing circuit of some type is used for this purpose. Sensing circuits operate to distinguish between a programmed, and an un-programmed (or burned and un-burned) fuse, usually by detecting a change in the resistance of the fuse device.

Sensing the state of a fuse device has been relatively straightforward in the past. However, advances in process technology have introduced some new issues. The operating and junction breakdown voltages of the latest semiconductor manufacturing processes, and those in development, continue to decrease. Accordingly, fuses requiring high programming currents and voltages, or thick gate oxides for reliable operation, are not viable for use in many of the newest integrated circuit devices. Thus, new fuses are being developed to be compatible with the constraints of new and upcoming processes.

A fuse having a lower programming current, while desirable for the reasons described above, creates difficulties in sensing the state of a fuse, particularly, the state of an un-programmed fuse. In the case of a fuse having a low programming current, the action of sensing the state of an un-programmed fuse may erroneously program the fuse if the current through the fuse during sensing is not low enough. Another issue arises because of the smaller geometries provided by new and upcoming process technologies. Smaller geometries include smaller line widths and device sizes. At reduced geometries, the resistance of the fuse device is difficult to control. In some cases, the difference in resistance between a burned fuse and an unburned fuse may be so small that the difference is difficult to detect with many fuse sensing circuits.

Thus, fuses having low programming currents, and/or a small change in resistance between an unburned state and a burned state, present difficulties in terms of providing safe and reliable sensing. For example, one type of sensing circuit is configured to sense the state of a pair of fuses forming one side of a resistor bridge circuit. The opposite side is formed by two reference resistors. One fuse device is programmed if one circuit state is desired (a logical "1", for example), and the opposite fuse device is programmed if the opposite state is desired. When sensing the state of the circuit including the fuse devices, the programmed state of one of the fuses can cause the current through the other fuse device to become high enough to program or partially program the unprogrammed device. In this manner, sensing the state of the fuse devices can cause the fuse circuit to become unreliable.

Other types of fuse sensing circuits have poor controllability and thus, rely on tight manufacturing controls to ensure a predictable output state when sensing the state of a fuse. In this case, manufacturing variations can cause the output of sensing the state of the fuse to be indeterminate, and therefore, unreliable. For this reason, while maintaining a low sensing current and voltage, it is also important to ensure reliable measurement by compensating for variations that can cause anomalous sensing at low voltage levels. This can be an issue particularly in the case of CMOS integrated circuit devices, where it is difficult to directly and reliably sense signals below about 100 mV due to random and systematic variations in threshold voltages (Vt) and effective channel lengths (Le). Further, fuse sensing circuits having poor controllability also have the potential to create unsafe currents for a fuse device having a low programming current.

The invention provides a static, low current sensing circuit for sensing the state of a fuse device, including fuse devices having a low programming voltage. The sensing circuit of the invention also provides relatively stable sensing capabilities over process, temperature and voltage variations in order to detect even relatively small changes in resistance between a programmed and unprogrammed state of a fuse device.

SUMMARY OF THE INVENTION

A static, self-biased, low current sensing circuit for sensing the state of a fuse is disclosed. The sensing circuit of the invention includes a first branch having a first sensing transistor, and a first fuse coupled to the source of the first sensing transistor. The fuse has an unprogrammed state characterized by a first resistance and a programmed state in which the fuse has a second resistance. The sensing circuit of the invention also includes a second reference branch having a second sensing transistor and a predetermined reference resistance coupled to the source of the second sensing transistor. The second reference branch is coupled to the first branch in a current mirror configuration. The predetermined reference resistance is matched to the fuse in an un-programmed state. The sensing circuit of the invention also includes an output node coupled to the drain of the first sensing transistor, the potential of the output node being determined by the state of the fuse device, such that the potential of the output node is within a first voltage range if the fuse device is programmed, and a second voltage range if the fuse device is un-programmed.

One embodiment of the sensing circuit of the invention includes a third branch having a third sensing transistor and a second fuse device coupled to the source of the third sensing transistor. The third branch is coupled to the second reference branch in a current mirror configuration. The state of the first and second fuse devices may be sensed either single-endedly in some embodiments, or differentially in other embodiments. Further, the fuse sensing circuit of the invention is readily extendible to form a redundant fuse array.

BRIEF DESCRIPTION OF THE DRAWINGS

FIG. 1A illustrates a side view of the fusible link device of one embodiment of the invention.

FIG. 1B illustrates a top view of the fusible link device of one embodiment of the invention.

FIG. 2A illustrates a side view of the fusible link device of one embodiment of the invention after programming.

FIG. 2B illustrates a side view of the fusible link device of an alternate embodiment the invention after programming.

DETAILED DESCRIPTION

Figure 3:
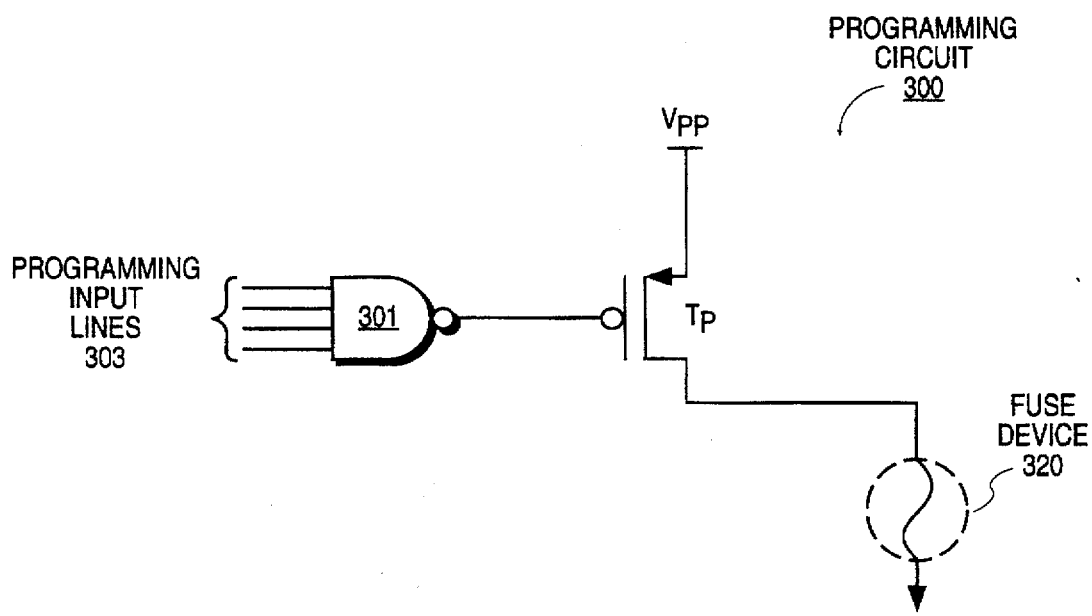
FIG. 3 illustrates the programming circuit and fusible link device of one embodiment of the invention.

A static, low current sensing device for sensing the state of a fuse device is disclosed. In the following description, numerous specific details are set forth, such as particular currents, voltages, types of fuses, transistor types, and numbers of fuses, in order to provide a thorough understanding of the invention. However, it will be appreciated by one of ordinary skill in the art that the invention may be practiced without these specific details. In other instances, well-known structures, circuit blocks, interfaces, and architectural functions have not been described in detail in order to avoid obscuring the invention.

Overview of the Fuse Device of One Embodiment of the Invention

FIG. 1A illustrates a side view of one embodiment of the silicide agglomeration fuse device 100 of the invention. The fuse device 100 is disposed on a semiconductor substrate 107, and is usually part of a larger integrated circuit device. In one embodiment, the polysilicon layer 105 is doped p-type. Other embodiments may include other types of doping including n-type as well as the formation of p-n junctions in the polysilicon layer 105. An example of a fuse device 200 including such a polysilicon layer, is described below in reference to FIG. 2B. An oxide layer 106, has a thickness 112 of about 3000–4000 Å in one embodiment, and is formed between the fuse device 100 and the substrate 107.

The fuse device 100 includes a silicide layer 104 disposed on a polysilicon layer 105. In one embodiment, the silicide layer 104 and the polysilicon layer 105 of the fuse device 100 are formed by the same processing steps used to produce the polysilicon and silicide gate layers of other devices on the integrated circuit device. In this manner, no additional processing steps are required to manufacture the fuse device 100.

The polysilicon layer 105 is formed on the oxide layer 106 and has a thickness 114 of 2500 Å in one embodiment. The sheet resistance of the polysilicon layer 105 is greater than 500 ohm/sq., about 1000 ohm/sq. in one embodiment, but may be more or less in other embodiments of the invention. In one embodiment, the silicide layer 104 is a titanium silicide ($TiSi_2$) film, although other silicides, such as tungsten, tantalum or platinum silicides, may also be used in accordance with the invention. The silicide layer 104, has a thickness 110 of about 225–250 Å in one embodiment, but may be thicker or thinner in other embodiments. The sheet resistance of the silicide layer 104 depends on its exact composition, but is about 1–10 ohm/sq, in one embodiment.

The fuse device 100 also includes contacts 101 at either end of the fuse device 100. The contacts 101 are coupled to the silicide layer 104 to provide an electrical connection between the fuse device and an external device or other components in the same integrated circuit device. In one embodiment, contacts 101 are coupled to metal interconnect lines (not shown) such that the fuse device 100 may be accessed for programming, sensing or other uses. The contacts 101 are tungsten plugs in one embodiment, but may be formed of other materials. In alternate embodiments, metal interconnect lines of the integrated circuit in which the fuse device 100 is formed, are coupled directly to the silicide layer 104 to provide the same functionality.

The fuse device 100 of the invention is described in more detail with reference to FIG. 1B, which shows a top view of the device 100 of one embodiment. The fuse device 100 includes a fuse region 122, also referred to herein as a fuse element, between two contact regions 120. The fuse device 100 may also include tapered transitional regions 116 between either end of the fuse region 122 and the respective contact region 120. In this embodiment, each transitional region forms approximately a 45° angle between the respective contact region 120 and the fuse region 122 such that current flowing between the contacts is concentrated in the fuse region 122 during programming. The geometries of the transitional regions 116 can contribute to lowering the required programming voltage of the fuse device 100 as described in more detail below. In alternate embodiments, contracts 101 are round, square or rectangular in shape. Also in alternate embodiments, the fuse device 100 may not include a transitional region between the contact regions 120 and the fuse region 122.

The size of the fuse region 122 can vary with different processing technologies, space considerations, and other fuse requirements. In one embodiment, the width 117 of the fuse region from the top view shown in FIG. 1B is close to the lower limit of the process technology used to form the fuse device 100, about 0.22 microns in one example, and the length 118 is between four to twenty-five times the width 117 of the fuse region 122. In a particular embodiment, the length 118 is about 10 times the width 117, but may be larger or smaller in other embodiments.

The contact region 120 is as small as possible in one embodiment, while still providing the minimum area required by contacts 101 based on their size, composition, and the programming current or voltage required to program the fuse device 100. The number of contacts 101 on the fuse device 100 may vary. Although two contacts 101 are shown at either end of the fuse device 100 in FIG. 1B, a larger or smaller number of contacts may also be used in accordance with the invention. In one embodiment, each of the contact regions 120 on either end of the fuse device 100 includes nine contacts 101. Multiple contacts 101 operating in parallel may be used to ensure that the required programming current flows through the fuse device 100 without overheating the contacts 101.

In operation, the fuse device 100 has a first resistance before it is programmed or "blown", and a significantly higher second resistance after programming. Before the fuse device 100 is programmed, its resistance is determined by the resistance of the silicide layer 104. During programming, a discontinuity is formed in the silicide layer 104. The resistance of the fuse device thus increases significantly based on the ratio of the resistance of the polysilicon layer 105 to that of the silicide layer 104.

The effects of programming the fuse device 100 are described in more detail in reference to FIGS. 2A and 2B. FIG. 2A illustrates a side view of the fuse device 100 of the invention after programming. A programming potential applied across contacts 101 causes current to flow from one end of the fuse device 100 to the other, through the silicide film layer 104. The current causes the silicide layer 104 to heat up, and the silicide itself to agglomerate as indicated by silicide agglomeration region 204. A discontinuity 206 is thus formed in the silicide layer 104 capping the polysilicon layer 105.

Because the silicide layer 104 has a much lower resistance than the polysilicon layer 105, the resistance of the fuse device 100 increases accordingly. Using the sample sheet resistances provided above (1–10 ohms/sq for the silicide layer 104 and >500 ohms/sq for the polysilicon layer), the resistance of the fuse device increases at least ten times after programming. In some embodiments, such as the embodiment described with reference to FIG. 2B, the increase in resistance is much greater. This change in resistance is then detected by a sensing circuit to determine whether the fuse device 100 has been programmed. The programming and sensing circuits of the invention are discussed in more detail below with reference to FIGS. 3–6.

FIG. 2B illustrates a side view of a programmed fuse device 200 in accordance with another embodiment of the invention. The fuse device 200 includes contacts 201, a silicide layer 234, an oxide layer 236 and a substrate 237 which are similar in composition, placement and functionality to identically named components of the fuse device 100 described above. The polysilicon layer 205 of the fuse device 200, however, differs from the polysilicon layer 105 of the fuse device 100. The polysilicon layer 205 of the fuse device 200 is doped n-type and includes one or more regions 208 which are doped p-type. The regions 208 which are doped p-type form p-n junctions, such as p-n junction 210, with the n-type regions of the polysilicon layer.

The fuse device 200 is programmed in the same manner as fuse device 100 using a low programming voltage and current. Programming the fuse causes the silicide layer 234 to agglomerate (as illustrated by silicide agglomeration 224) to form a discontinuity 226. If the discontinuity 226 is formed over a p-n junction such as p-n junction 210, current flow between the contacts 201 is diverted from the silicide layer 234 at the discontinuity 226, through the polysilicon layer 205, and in this case, through the p-n junction 210. In this manner, the ratio of the resistance of the programmed fuse 200 to an unprogrammed fuse identical to fuse 200, is significantly increased in the case where the discontinuity 226 is formed over a p-n junction 210 during programming.

The programming voltage, and thus, current required to program the fuse device 100 is relatively low. It is to be understood that the fuse device 100 is referred to herein for purposes of illustration. Other similar fuse devices, such as the fuse device 200 are programmed, sensed, and operate in a similar manner. In one embodiment, the fuse device 100 may be blown using a programming potential of about 2.0 volts. Other embodiments have different programming voltages which depend on the thickness of the silicide layer and other geometries of the fuse device 100. As mentioned above with reference to FIG. 1B, the geometry of the transition region 116 between the contact regions 120 and the fuse region 122, contributes to the low programming voltage of one embodiment by focusing the current density flowing through the fuse device 100 into the fuse region 122. The low programming potential of the fuse device 100 makes it ideal for use in integrated circuit devices manufactured on the latest process technologies having thin gate oxides, and thus, low junction breakdown voltages.

The fuse device 100 of the invention provides the additional advantage of being small and thus, inexpensive in terms of silicon space. Further, the formation of fuse devices such as the fuse device 100 in accordance with the invention, does not require additional processing steps. The fuse device 100 may be formed using the standard processing steps already performed to create other features of the integrated circuit device on which the silicide agglomeration fuse device is implemented. Implementing the fuse device 100 of the invention without additional processing steps also contributes to its low cost.

In addition to being inexpensive to implement and viable for use on low voltage process technologies, the silicide agglomeration fuse device of the invention can be programmed without damaging overlying dielectric layers. Further, the fuse device of the invention does not have to be exposed to the air to be programmed, and the programming step itself does not create holes in the passivation or other layers surrounding the fuse device as with some prior art fuse devices.

The Programming Circuit of One Embodiment of the Invention

Referring now to FIG. 3, a programming circuit 300 in accordance with one embodiment of the invention is illustrated. The fuse device 320 of one embodiment, is similar to the fuse devices 100 and 200 as described above, and is represented by the symbol within the dotted line in FIG. 3. The fuse device 320 of the invention is coupled to Vss or ground at one end and the opposite end of the fuse device 320 is coupled to the drain of a p-channel programming device Tp. The source of the transistor Tp is coupled to Vcc. The size of the programming circuit is kept small by coupling one end of the fuse device 320 to ground such that only one p-channel transistor is required. In alternate embodiments, the programming circuit of the invention may include an n-channel transistor with complementary signals such that the fuse device 320 is programmed when the n-channel transistor is turned on.

Logic such as NAND device 301 is coupled to the gate of the transistor Tp to control the programming circuit of one embodiment of the invention. In one embodiment, the NAND device 301 is located very close to the transistor Tp on the integrated circuit device in which they are formed. In this manner, the effects of noise and other anomalies which increase over signal line length are reduced, and the risk of erroneously turning on the programming transistor Tp is reduced. Programming of the fuse device 320 is controlled through programming input lines 303, which may include any number of signal lines. In this example, inputs received on the programming input lines 303, which result in a low signal at the gate of the transistor Tp will turn transistor Tp on. Turning transistor Tp on causes current to flow through fuse device 320. In this manner, the fuse device 320 can be selectively programmed. In one embodiment, the fuse device 320 is programmed at the wafer level using a probe device in conjunction with the programming circuit 300. In other embodiments, the fuse device 320 is programmed at a different stage of the integrated circuit device manufacturing process or after the integrated circuit device including the fuse device 320 is packaged.

The Sensing Circuit of One Embodiment of the Invention

The static, self-biased, high-sensitivity, low read current sensing circuit 400 of one embodiment of the invention is described with reference to FIG. 4. For purposes of illustration, the operation of the sensing circuit 400 is described in conjunction with the fuse device 450 which is similar to the fuse devices 100 or 200 illustrated in FIGS. 1-2 in one embodiment. However, it will be appreciated by those skilled in the art that the sensing circuit 400 of the invention may also be used to sense other types of fuse devices. The sensing circuit 400 is well-suited for use with a fuse device such as fuse device 450 of the invention. The fuse device 450 of the invention has a low programming voltage, and thus, a low programming current. Therefore, it is important that a sensing circuit used to sense whether the fuse device 450 has been programmed or burned, does not burn an unburned fuse in the sensing process. Further, the fuse device 450 may also exhibit only a small change in resistance between an unprogrammed state and a programmed state. Therefore, the sensing circuit used to sense the fuse device 450 must be sensitive enough to detect relatively small changes in resistance to reliably determine whether the fuse device 450 has been programmed. As will be shown, the sensing circuit 400 of the invention provides high sensitivity, reliable sensing of fuses using a low sensing voltage and current. Additional advantages of the sensing circuit 400 are discussed in more detail below.

Figure 4:
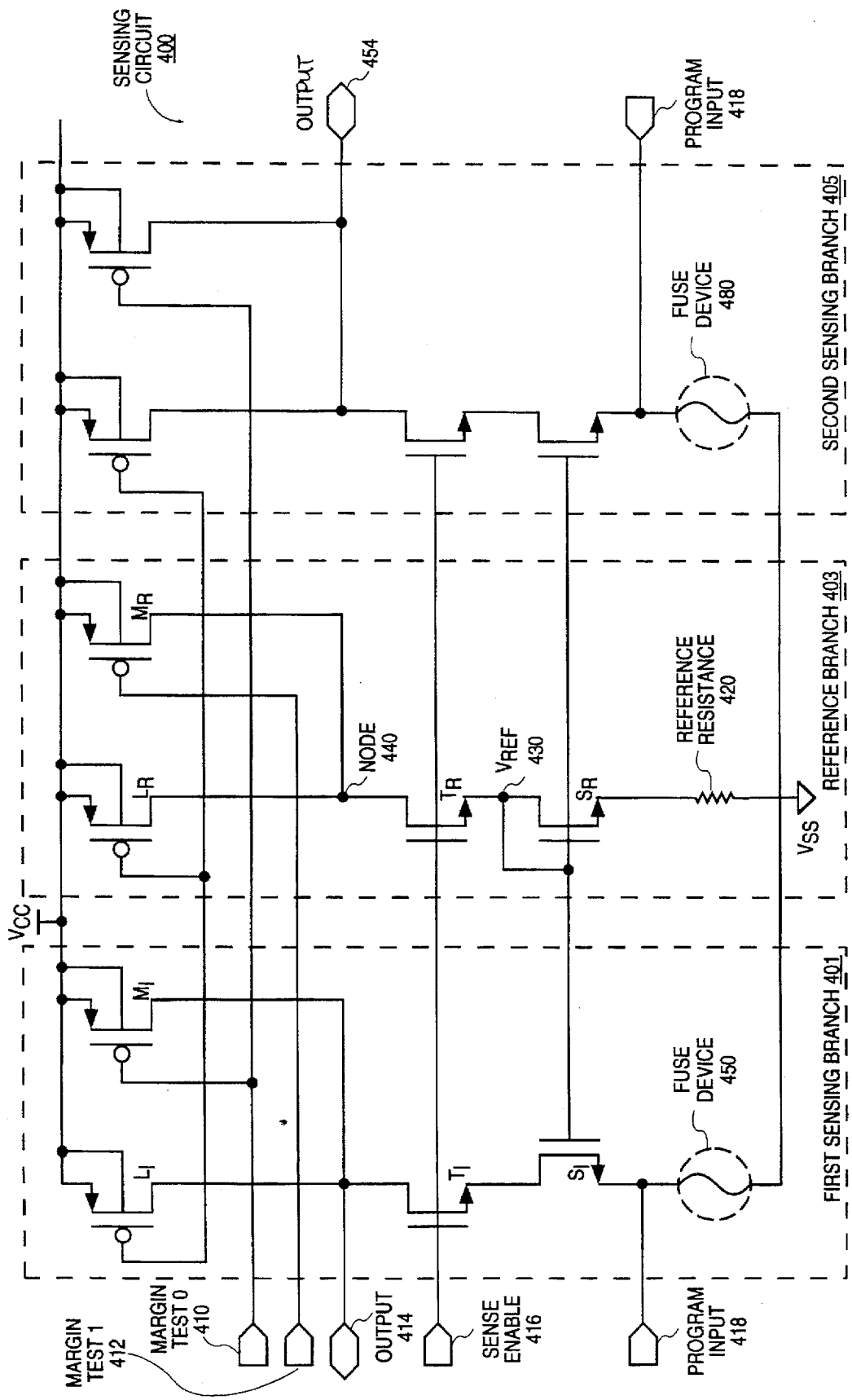
FIG. 4 illustrates the sensing circuit and fusible link devices of one embodiment of the invention.

The sensing circuit 400 of one embodiment of the invention is illustrated in FIG. 4 and includes three branches: a first sensing branch 401, a reference branch 403, and a second sensing branch 405. The second sensing branch 405 is provided in FIG. 4 to demonstrate the capabilities of the sensing circuit 400 to provide for differential sensing in one embodiment, and also to extend to a redundant fuse arrangement. The operation of the sensing branches 401 and 405 of the sensing circuit 400 are described herein with reference to the first sensing branch 401. However, it is to be understood that the second sensing branch 405 operates in a similar manner to the first sensing branch 401. Additional details of the differential sensing capabilities of the invention, and the redundant fuse arrangement of one embodiment are discussed below.

As illustrated in FIG. 4, one end of the fuse device 450 is coupled to ground and the opposite end of the fuse device 450 is coupled to a program input 418 to provide for programming the fuse device 450. The program input 418 is coupled to the programming device Tp of a programming circuit, such as programming circuit 300 discussed above with reference to FIG. 3. It should be noted that in embodiments in which Tp of the programming circuit is an n-channel device, the sensing circuit 400 of the invention includes devices and signals complementary to those illustrated in FIG. 4. In other words, signals such as the sense enable signal are active low instead of active high, p-channel devices are replaced with n-channel devices, etc. In other respects, the operation of a complementary sensing circuit is similar to the operation of the sensing circuit 400 illustrated in FIG. 4.

Referring back to FIG. 4, also coupled to the fuse device 450, and included within the first sensing branch 401, is a sensing device S1. The source of the sensing device S1 is coupled to one end of the fuse device 450 and the drain of the sensing device S1 is coupled to the drain of a load device L1, and a margin testing device M1, through a sense enable device T1.

The reference branch 403 includes a sensing device SR coupled to a load device LR and a margin testing device MR through a sense enable device TR in a similar manner. The reference branch 403 also includes a reference voltage node $V_{REF}$ 430, discussed in more detail below, and a reference resistance 420. In one embodiment, the reference resistance 420 comprises one or more fuse devices in series and identical to fuse device 450 in its un-programmed state, such that the reference resistance 420 in the reference branch is matched to the un-programmed fuse devices 450 and 480. In alternative embodiments, the reference resistance 420 is matched to the fuse devices 450 and 480 by forming the reference resistance 420 from a section of fuse material similar to the fuse material used to form fuse 450 and 480. The gates of the sensing device S1 of the first sensing branch 401 and SR of the reference branch 403 are coupled together, as are the gates of sense enable transistors T1 and TR which are coupled to a sense enable input 416. The gate of SR is coupled to its drain at the node 430, thus establishing a current mirror configuration between devices S1 and SR.

It should be noted that load devices L1 and LR are illustrated as transistors, but may comprise other types of load devices. Further L1 and LR are matched such that they vary in the same manner in response to process, temperature and voltage variations, for example. Other devices in the sensing branches 401 and 405 are also matched to corresponding devices in the reference branch 405 such that they vary in the same manner in response to similar conditions.

The current mirror configuration of the sensing circuit 400 of the invention is one factor contributing to the low sense current of the sensing circuit 400 when sensing the state of a fuse device, such as fuse device 450. As the reference branch 403 is optimized for low current, the current in the outer sensing branches 401 and 405 is kept at a safe level. The details of how the reference branch 403 is optimized for low current are discussed below.

The current mirror configuration within the sensing circuit 400 also operates to improve the sensitivity of the sensing circuit 400 by biasing S1 and SR to a region of operation in which S1 and SR are very sensitive to changes in the source resistance. The portion of the sensing circuit 400 comprising the current mirror, the fuse device 450 and the reference resistance 420 can be termed a "degenerate current mirror". In operation, because similar devices in the fuse sensing branches 401 and 405 and the reference branch 403 are matched, including the fuse devices 450 and 480 in an unburned state and the reference resistance 420, the act of burning a fuse creates a resistance offset in the current mirror which is reflected at the outputs 414 and 454 of the sensing circuit 400. The fuse device 450 is used as a source degeneration resistor changing the current in the sensing branch when the state of the fuse device changes. The change in current through the fuse device 405 is reflected by a change in voltage at the output 414.

The sense enable input 416 controls the sensing function of the sensing circuit 400. When the sense enable signal line 416 is at Vss (ground), the MOS devices T1 and TR are off. When sense enable devices T1 and TR are turned off, the load devices L1 and LR are disconnected from the sensing devices S1 and SR, and thus, there is no current flow through the sensing circuit branches. Further, the load devices L1 and LR are coupled to Vcc at one end, and thus, pull the output potential of output signal line 414 to the supply voltage. This ensures that devices with inputs coupled to the outputs 414 and 454 of the sensing circuit 400, do not receive an input potential in a range which would partially turn such devices on. In this manner, devices coupled to the sensing circuit 400 do not draw power when the sensing circuit 400 is not enabled.

In one embodiment, the sense enable input signal line 416 is responsive to a reset signal from an external source. As the sense enable input 416 of the sensing circuit 400 transitions from a low to a high state upon reset, the MOS sense enable transistors T1 and TR are turned on. Turning device TR on, creates a current path between the voltage supply Vcc and the sensing device SR of the reference branch 403 pulling the gate of the sensing device SR up, causing it to conduct. As the sensing device SR is turned on, the potentials on nodes 440 and $V_{REF}$ 430 are pulled toward Vss (ground). However, the MOS load device LR limits the voltage at node $V_{REF}$ 430 from being pulled all the way to ground, thus establishing a reference voltage at node $V_{REF}$ 430. In this manner, the sensing circuit 400 is "self-biased".

The voltage produced at node 440 forms an additional reference voltage relative to the output 414 of the first sensing branch 401 and the output 454 of the second sensing branch 405. The voltage at node 440 can be used to adjust the trip point of logic receiving the output(s) of the sensing circuit 400. In one embodiment, as mentioned above, the reference resistance 420 comprises one or more unprogrammed fuse devices which are identical to the fuse device 450 of the invention in an un-programmed state. In this manner, the reference resistance 420 is matched to the fuse device 450. Additionally, the sizes of sense enable devices T1 and TR are matched as are the sizes of the sensing devices S1 and SR. By matching the resistances and devices in the sensing branches 401 and 405 to the resistances of corresponding devices in the reference branch 403, even small changes in the resistance of the fuse device 450 are more easily detected.

Single-Ended Operation of the Fuse Sensing Circuit of the Invention

The fuse sensing circuit 400 of the invention may be configured such that the state of the fuse device 450 is interpreted either single-endedly or differentially. That is to say, the state of the fuse device 450 may be determined by comparing the voltage on the output 414 to the trip point voltage of logic coupled to the sensing circuit 400 (referred to as single-ended sensing), or the fuse devices 450 and 480 may be programmed to opposite states, and the state of fuse device 450 may be detected differentially by comparing the voltages on the output nodes 414 and 454. The trip point voltage of the common logic indicates whether a voltage level is interpreted as a logical "1" or a logical "0" and are well-known to those of ordinary skill in the art.

In the single-ended configuration, the reference resistance 420 is selected to be matched, lithographically and in material, yet higher than the resistance of an unprogrammed fuse device 450. By using unprogrammed fuse devices similar to the fuse device 450 in an unprogrammed state thereby matching the reference resistance 420 to the fuse device 450, variations in the reference resistance due to manufacturing tolerances, temperature or other reasons, follow variations in the fuse device 450. In one embodiment, the reference resistance 420 comprises five unburned fuse devices matched to the unprogrammed fuse device 450. Thus, the reference resistance 420 is five times the resistance of the unprogrammed fuse device 450. Other embodiments include a different number of fuse devices, but more than one, to form the reference resistance 420. By selecting the reference resistance 420 such that the ratio of the reference resistance 420 to the resistance of the fuse device 450 in an unprogrammed state is high, a default offset voltage is created initially. In this embodiment, the higher resistance of the reference resistance 420 relative to the unburned fuse device 450 creates an output low voltage which is low enough to be interpreted as a "0" because it is below the common logic trip point. In one embodiment, the output voltage at output 414 when fuse device 450 is unprogrammed is approximately 100 mV. Thus, a default state, including a default offset, is created such that an unburned fuse is interpreted as a logical "0".

The fuse-to-reference load ratio tolerates manufacturing variations because the source load devices are matched, and also because of the current mirror connection between the reference and fuse branches. Further, the default offset referred to above creates a higher threshold for variations in Vt and Le to overcome before they have an effect on the operation of the sensing circuit 400. The lower source load (fuse device 450) of sensing device S1 creates a higher gate-to-source (VGS) voltage across the sensing device S1. The higher VGS across the sensing device S1 increases the current through SR. The increased current causes the drain of the load device L1 to droop until a new equilibrium point is established.

In one embodiment, if fuse device 450 is not programmed, the equilibrium point reached at the output node 414 is about 100–150 mV. This low output potential can be interpreted by external gates such that the unburned state of the fuse device 450 is detected.

When fuse device 450 is burned, a higher potential is created on the source of sensing device S1 based on the higher resistance of the fuse device 450. The higher potential on the source of sensing device S1 narrows the gap between the source and gate potentials, or lowers the VGS, of the sensing device S1. The current flowing through the sensing device S1 is thus, also reduced. The passive load device L1 of the first sensing branch 401 then pulls up the potential of the output node 414. In an embodiment in which the resistance of the fuse device 450 when programmed is five times as great as the reference resistance 420, the output node 414 is pulled up to a minimum of about 1.7 volts where Vcc is set at 2.0 volts. An even higher ratio between the resistance of the fuse device 450 when programmed, and the reference resistance 420, would pull up the output voltage on output node 414 even closer to the Vcc supply voltage. In some embodiments, once the state of the fuse device 450 is detected, the logical interpretation of the state is stored in a register or other storage device (not shown).

If the fuse device 450 is burned, that is to say, it has been programmed, the resistance of the fuse device 450 is increased. As discussed above, in one embodiment, the resistance of the fuse device increases by at least ten times in comparison to a similar un-programmed fuse device, and may be increased in the range of 10–1000 times. Even higher increases are possible in some embodiments. Although the programmed resistance of a fuse device such as fuse device 450 may vary widely in some cases based on manufacturing variations, the sensing circuit 400 of the invention provides the capability to detect very low acceptable programmed resistance values, for fuse device 450. Additionally, the sensing circuit 400 of the invention can reliably distinguish between the programmed state of a fuse device 450 and the unprogrammed state of a fuse device 450 even where the ratio of the programmed resistance to the unprogrammed resistance is very small.

It should be noted that the value or size of the reference resistance 420 may be varied to further increase the ratio between the fuse device 450 in an unprogrammed state and the reference resistance 420. The increased ratio between the unprogrammed fuse device resistance and the reference resistance 420, can increase the immunity of sensing circuit 400 to noise, offsets, and Vt and Le variations in some embodiments.

Differential Sensing Capabilities of One Embodiment

In an alternate embodiment, the state of the fuse device 450 can be differentially sensed. In this embodiment, the reference resistance 420 is selected to be close to the resistance of the fuse devices 450 and 480. In one embodiment, the reference resistance 420 comprises one unprogrammed fuse device matched to the fuse devices 450 and 480 such that the resistances of the fuse devices 450, 480 and the reference resistance 420 are as close to each other as possible. In other embodiments, multiple fuse devices are coupled in series to form the reference resistance 420 to increase the sensitivity of the sensing circuit 400.

The operation of the sensing circuit 400 in this configuration is similar to the operation of the circuit as described above. However, in this configuration, one of the fuse devices 450 or 480 is programmed if one logical state is desired, and the other fuse device is programmed if the opposite logical state is desired. Once the programming step is completed, the sensing circuit 400 is enabled, and the voltage at the output 414 of the first sensing branch is compared to the voltage at the output 454 of the second sensing branch. In one embodiment, if the fuse device 450 is unprogrammed, and the fuse device 480 is programmed, the voltage at the output node 414 will be lower than the voltage at the output node 454, and the circuit will be interpreted to be a logical "0". In other embodiments, the opposite may be true depending on the connections of the differential amplifier (not shown). The use of differential amplifiers to measure the difference in voltage between two nodes is well-known to those of ordinary skill in the art.

In one embodiment, the current in the first sensing branch 401 branch of the sensing circuit 400 is about 300 uA in this configuration. If fuse device 450 has a programming current of about 6 mA, the 300 uA current is within a safe range for sensing the unburned fuse device 450, without also programming it.

The Margin Testing Capabilities of One Embodiment of the Sensing Circuit

One embodiment of the sensing circuit 400 of the invention also provides capabilities for manufacturing programming verification. In other words, using the sensing circuit 400 of one embodiment of the invention, it is possible to test the margin of the fuse device 450 to identify partially burned fuses, unacceptable variations in the fuse device 450, or other marginal conditions that may make the fuse device unacceptable for use. Such conditions may arise, for example, if the sensing of the fuse device 450 under nominal conditions yields the correct state of the fuse device 450, but a "false read" could occur due to aging, noise, thermal, or other environmental conditions. The "margin-mode" testing means of the invention is designed to instigate the false read during a verification process. In this manner, field failures due to such an issue are avoided.

The margin-mode testing means of the sensing circuit 400 of the invention is described with continuing reference to FIG. 4. Margin mode testing devices M1 of the first sensing branch 401 and MR of the reference branch 403 enable margin testing of the fuse device 450 by upsetting the balance between the matched p-channel passive load devices, L1 of the first sensing branch 401, and LR of the reference branch 403. The drain of p-channel margin mode testing device M1 is coupled to the drain of device T1. Similarly, the drain of p-channel margin mode testing device MR is coupled to the drain of device TR. The margin mode testing capabilities of the sensing circuit 400 are controlled using margin test 0 input 410 coupled to the gate of margin mode testing device M1 and the corresponding device in the second sensing branch 405, and margin test 1 input 412 coupled to the gate of margin mode testing device MR.

A low signal in margin test 1 input 412 turns on margin test mode device MR to initiate the first margin test mode. Turning on device MR, slightly increases the current flow in the reference branch 403, and, because of the current mirror connection, the current flow in the first sensing branch 401 also increases. In this manner, the output potential at the output node 414 is depressed. Thus, if the fuse device 450 is sensed and identified as being programmed, and the programmed state of the device 450 is marginal, this margin testing mode will cause the fuse device to be sensed as unprogrammed. The readout voltages at output node 414 which indicate programmed and unprogrammed states of fuse devices such as fuse device 450, depend on the Vcc of the sensing circuit 400, the resistances of programmed and unprogrammed fuse devices, and other factors.

A fuse device 450 that is identified as being unprogrammed, but is marginal, can also be detected by the second mode of the margin testing of the invention. A low signal on margin test 0 input 410, turns on margin mode test device M1. Turning on device M1 decreases the resistance of the device M1 and thus, pulls up the output potential on output node 414. If the fuse device 450 was identified as being unprogrammed during sensing, but is marginal, the output potential on output node 414 will so indicate. In other words, the output potential on the output node 414 will increase enough that the value read is identified as indicating a programmed fuse device.

In this manner, the sensing circuit 400 of the invention reduces the possibility of field failures due to marginally programmed or unprogrammed fuse devices. The margin mode testing means of the invention operates in a similar manner to detect a marginal fuse device in the second sensing branch 405 as illustrated in FIG. 4. Thus, if the fuse devices of both the first and second sensing branches 401 and 405, are used as redundant fuses, and both are verified to be in the desired state, the possibility of field failure is further reduced.

The Redundant Fuse Array of One Embodiment of the Invention

Figure 5:
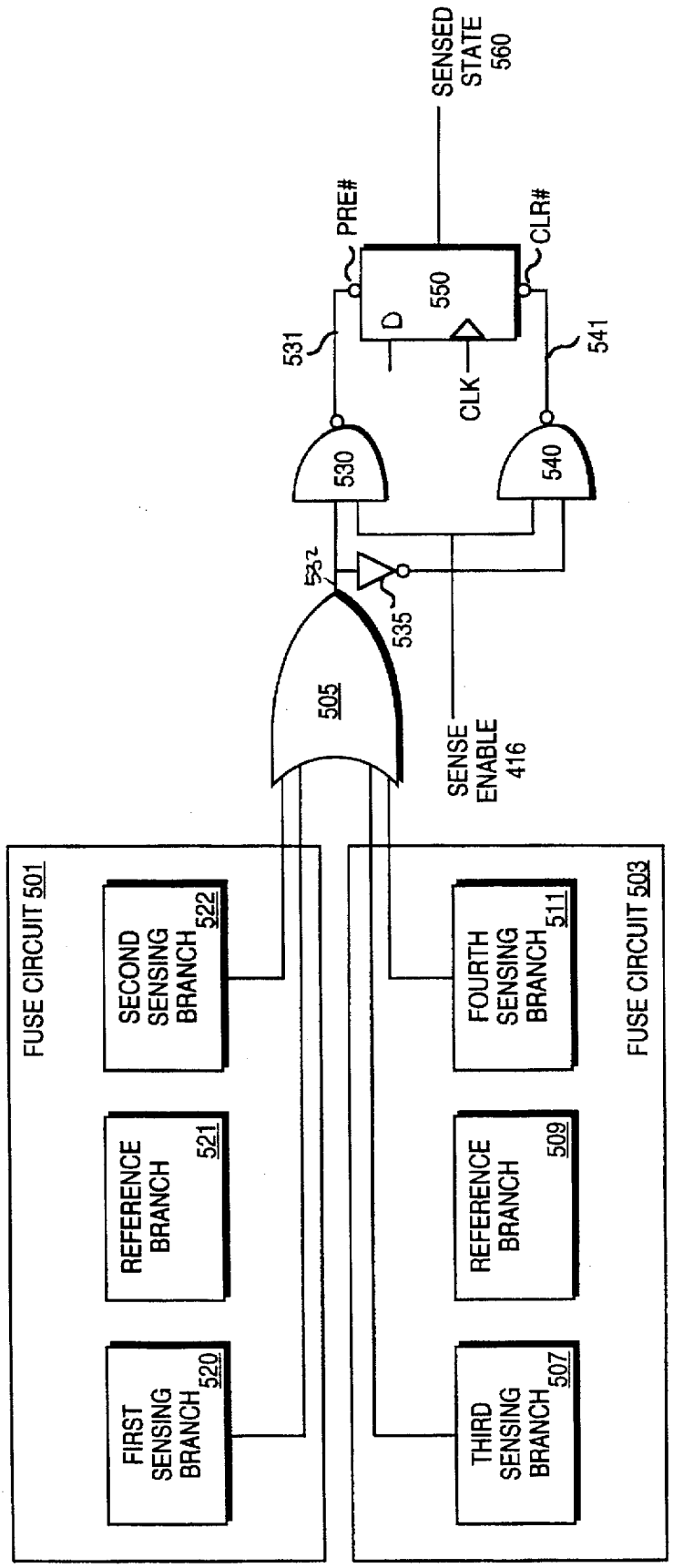
FIG. 5 illustrates an arrangement of the redundant fuse devices of one embodiment of the invention.

As illustrated in FIG. 5, the fuse devices of the invention may be arranged in a redundant array. It is desirable to provide for redundant fuse devices such that, if a particular fuse device is defective, or somehow damaged, as detected by a probe test, a similar fuse device may take its place.

FIG. 5 provides one example of how a redundant array of fuse devices according to one embodiment of the invention may be arranged. The array of redundant fuse devices in FIG. 5 includes two fuse circuits 501 and 503, each of which includes fuse circuits and reference circuits similar to those of the sensing circuit 400 of FIG. 4, and a logical OR gate 505. Fuse circuit 501 includes sensing branch 520, reference branch 521, and a second sensing branch 522. The outputs of the sensing branches 520 and 522, such as output 414 in FIG. 4, are coupled to the OR gate 505. Similarly, the fuse circuit 503 includes a third sensing branch 507, a reference branch 509, and a fourth sensing branch 511. The outputs of each of the sensing branches of the fuse circuit 503 are similarly coupled to the OR gate 505.

In the redundant fuse array of FIG. 5, if any one of the fuse devices in sensing branches 520, 522, 507 and 511 is programmed, the output signal from OR gate 505 will be consistent with a signal produced by a programmed fuse device. Thus, the fuse device programmer can choose to program one, some, or all of the fuse devices in the redundant fuse array of FIG. 5 to achieve a similar result. This approach provides flexibility to the fuse programmer to determine acceptable trade-offs between fuse programming and verification time, and certainty of programming the fuse device. For example, a fuse programmer may choose to program only one fuse device, verify it, and if it passes the margin mode testing sequence described above, stop there, otherwise, program another fuse device. Alternately, a fuse programmer may decide to program all four fuse devices in the redundant array of FIG. 5 to ensure that a fuse is programmed.

In one embodiment, the OR gate 505 is constructed of inverters coupled to each of the outputs of the sensing branches followed by a NAND gate. In this manner, each of the inverters has the same trip point, or voltage at which it is turned on. In other embodiments, OR gate 505 may be constructed using a NOR gate coupled to all of the outputs followed by an inverter. This configuration, however, can cause issues as the trip point for each of the signals from the sensing branches 520, 522, 507, and 511 going into the OR gate 505 may be different due to stacked p-channel devices. To provide further optimization, the sizes of the devices forming the OR gate 505 can be selected such that the trip point of the inverters within the OR gate 505 is matched to the reference voltage at the node 440 which provides maximum sensitivity.

In another embodiment, the OR gate 505 may be replaced by an AND gate. This configuration may be desirable to ensure an unprogrammed fuse device. In this embodiment, marginally unprogrammed fuse devices would not affect the output of the AND gate used in place of OR gate 505. Further, an XOR gate may be used in place of the OR gate 505 in other embodiments. Use of an XOR gate provides for a case in which a polysilicon line is broken, for example, and a fuse appears to be programmed. Use of an XOR gate allows the fuse array to be useful even if an unprogrammed state is desired. In this manner, the redundant fuse array of the invention provides additional flexibility and can compensate for defective fuse devices, a defective circuit arrangement, or faulty programming.

In one embodiment, additional combinatorial logic is provided such that the state of the fuse devices in the fuse array of FIG. 5 may be read and latched. Referring still to FIG. 5, OR gate 505 is coupled to a NAND gate 530, and through an inverter 535, to another NAND gate 540. The other inputs to NAND gates 530 and 540 are provided by the sense enable input 416 (FIG. 4). The output of the first NAND gate 530 is coupled to the preset (PRE#) input, and the output of the second NAND gate 540 is coupled to the clear (CLR#) input of an edge-triggered flip-flop 550. Both the PRE# and CLR# inputs are active low as indicated by the '#' following the signal name as is well-known in the art. PRE# and CLR# inputs are asynchronous in the embodiment illustrated in FIG. 5, but may be synchronous in other embodiments. The flip-flop 550 also receives a clock input and may receive the output of another array of fuse devices on the data input such that fuse arrays may be cascaded and the state of each fuse array may be read serially.

A reset signal to the sense circuit asserts the sense enable signal 416. The state of the fuse array is provided at the output of the OR gate 505 on signal line 532 and both signals are provided to the NAND gates 530 and 540 (the signal from the OR gate 505 being inverted before reaching NAND gate 540). If the state of the fuse array is a logical "1", the output signal of NAND gate 530 is low, and the PRE# signal is asserted. Conversely, if the state of the fuse array is a logical "0", the output signal of NAND gate 540 is low, and the CLR# signal is asserted. In this manner, the state of the fuse array comprising fuse circuits 501 and 503 can be stored in the flip-flop 550, and later scanned or otherwise used internally. It will be appreciated by those of ordinary skill in the art that other types of latch circuits or flip-flops may be used to perform a similar function as flip-flop 550. Further, it will be appreciated that, although the combinatorial and storage logic including OR gate 505, NAND gates 530 and 540, and flip-flop 550 are shown coupled to a fuse array, the combinatorial and storage logic of the invention may also be used in accordance with a sensing circuit including a single fuse.

Thus, the static, low current sensing circuit of the invention provides the capabilities to reliably and safely sense the state of a fuse having a low programming current, while preventing erroneous programming of unprogrammed fuse devices. The static nature of the sensing circuit of the invention also provides the advantage that no special timing circuitry is required. Further, the sensing circuit of the invention is self-biased, and relatively stable such that the state of fuse devices can be reliably sensed even with variations in manufacturing tolerances, temperature, and voltage. The sensing circuit of the invention is optimized for low current and high sensitivity to provide for reliable sensing of programmed versus unprogrammed states of fuses even where the change in resistance between the two states is relatively small. Further, the margin testing modes of the invention reduce the chances of field failures due to marginal programmed or unprogrammed fuses. The fuse devices and sensing circuits of the invention are easily extendable to provide a redundant fuse array and can be configured to provide both differential and single-ended sensing.

The fuse sensing circuit of the invention provides all of the advantages above, while maintaining a relatively small sensing circuit size. The reference branch of the fuse sensing circuit is laid out in close proximity to both fuse sensing branches in some embodiments. The close proximity of the reference and sensing branches of the fuse sensing circuit on an integrated circuit device minimizes the chance of device mismatches due to manufacturing variations, and due to the relatively short interconnects between devices of the sensing circuit, also reduces the effects of voltage droop and noise.

One Embodiment of The Fuse Programming and Sensing Method of the Invention

Figure 6:
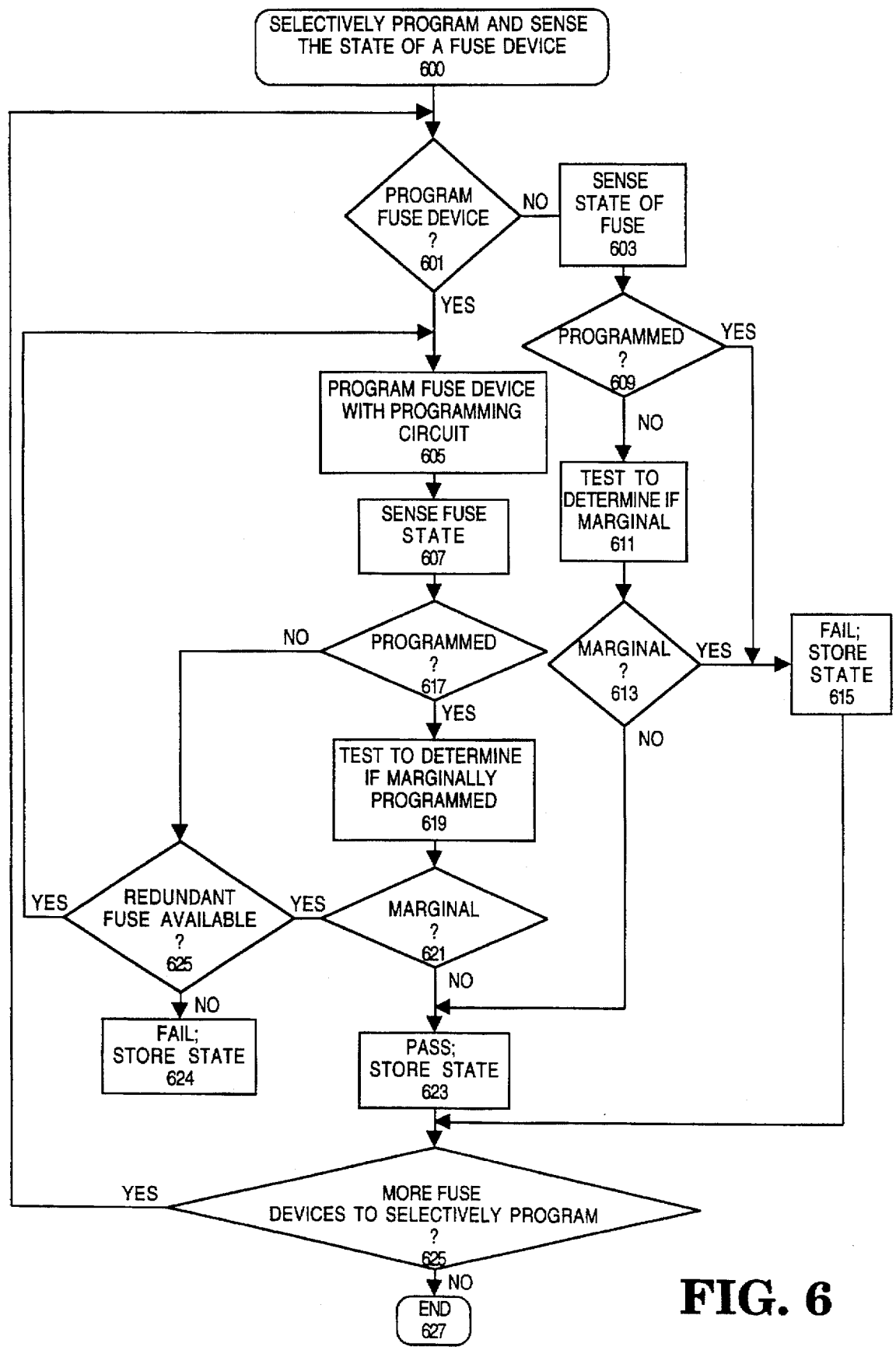
FIG. 6 illustrates the fuse programming and sensing method of one embodiment of the invention.

The fuse programming and sensing method of one embodiment of the invention is illustrated in FIG. 6. The method of selectively programming and sensing the state of a fuse device begins in processing block 600. In decision block 601, it is determined whether it is desired to program the fuse device or not. If programming is desired, in processing block 605, the fuse is programmed with a fuse programming circuit such as is described above in reference to FIG. 3. In processing block 607, sensing circuitry senses the state of the fuse device to determine whether or not it is programmed. At decision block 617, if the fuse device is programmed, at step 619, the fuse device is tested to determine whether it is marginally programmed and likely to fail later. In decision block 617, if the device is not programmed, the method of the invention determines whether a redundant fuse device is available at decision block 625.

At decision block 621, if the fuse device is determined to be marginal, and a redundant fuse device is available (decision block 625), the redundant fuse is programmed starting again in processing block 605. If the device is determined to be marginal, but a redundant fuse device is not available, a defective device is indicated in processing block 624. If there are other fuses to selectively program (decision block 626), processing returns to decision block 601, otherwise, processing ends at block 627.

Referring back to decision block 621, if the fuse device is determined not to be marginal, the device is indicated as being good at step 623. Then as described above, if there are additional devices to selectively program, processing restarts at decision block 601. If all devices have been selectively programmed as required, processing ends at block 627.

Returning to decision block 601, if it is desired that the fuse device remain unprogrammed, the state of the device is sensed in block 603. In decision block 609, if the device is programmed, a failure is indicated, and the processing ends unless there are additional devices to be selectively programmed (steps 626 and 627). In alternate embodiments, an array of redundant fuse devices is coupled to a logical AND gate such that a failure is not indicated unless all of the fuse elements in the array are either programmed or marginally unprogrammed. Back to decision block 609, if the fuse device is not programmed, it is tested in processing block 611 to determine whether it is marginal. If the fuse device is found to be marginal, a failure is indicated (unless a redundant array as described above is provided), and processing ends at block 627 unless there are other devices to selectively program (processing block 626). Alternately, if the fuse device is unprogrammed, and also found not to be marginal, the device passes, its state is stored where appropriate, and processing continues if additional devices are desired to be selectively programmed. It should be noted that, although the sensing step follows the step of programming the fuse device in one embodiment, in alternate embodiments, the state of the fuse device may be sensed first, and then programmed if desired.

Thus, the invention provides a static, low current sensing circuit for sensing the state of a fuse device, including a fuse device having a low programming current, and a redundant array of fuse devices. Whereas many alterations and modifications of the invention may occur to one of ordinary skill in the art after having read the foregoing description, it is to be understood that the particular embodiments shown and described by way of illustration are in no way intended to be considered limiting. Therefore, references to details of various embodiments are not intended to limit the scope of the claims which in themselves recite only those features regarded as essential to the invention.

I claim:

1. A fuse sensing circuit comprising:
   a first circuit including a first fuse, the first circuit being coupled to receive first and second voltage supplies;
   a second circuit coupled to the first circuit in a current mirror configuration and coupled to receive the first and second voltage supplies, the second circuit including a reference resistance;
   a first output node coupled to the first circuit to indicate a state of the first fuse, a potential on the first output node being within a first range if the first fuse is un-programmed or within a second range if the first fuse is programmed; and
   a first margin test device coupled to the first circuit, the first margin test device changing the potential on the first output node when the first margin test device is turned on such that the state of the first fuse is identified as being marginal if the changed potential is not within either of the first or second ranges.

2. The fuse sensing circuit of claim 1 wherein the reference resistance comprises one or more fuses in series, the one or more fuses being matched lithographically and in material to the first fuse in an un-programmed state.

3. The fuse sensing circuit of claim 1 wherein corresponding devices included in the first and second circuits are matched lithographically and in material.

4. The fuse sensing circuit of claim 1 wherein the current mirror configuration is established by coupling a first sensing transistor in the first circuit to a second sensing transistor in the second circuit, and wherein the first circuit further includes a first sense enable transistor coupled between the first sensing transistor and the first voltage supply and the second circuit further includes a second sense enable transistor coupled between the second sensing transistor and the first voltage supply, the first and second sense enable transistors being coupled to receive a sense enable signal to enable sensing of the first fuse.

5. The fuse sensing circuit of claim 4 further including first and second load devices, the first load device being coupled between the first sense enable transistor and the first voltage supply, the second load device being coupled between the second sense enable transistor and the first voltage supply, the first and second load devices being matched in layout and materials.

6. The fuse sensing circuit of claim 1 wherein the first margin testing device raises the potential on the first output node when the first margin test device is turned on such that the first fuse is identified as being marginally un-programmed if the raised potential is outside of the first range, the sensing circuit further including a second margin testing device coupled to the second circuit, the second margin testing device lowering the potential on the first output node when the second margin testing device is turned on such that the first fuse is identified as being marginally, programmed if the lowered potential is outside of the second range.

7. The fuse sensing circuit of claim 5 wherein the first margin testing device raises the potential on the first output node when the first margin test device is turned on such that the first fuse is identified as being marginally un-programmed if the raised potential is outside of the first range, the sensing circuit further including a second margin testing device coupled to the second circuit, the second margin testing device lowering the potential on the first output node when the second margin testing device is turned on such that the first fuse is identified as being marginally programmed if the lowered potential is outside of the second range.

8. The fuse sensing circuit of claim 1 further including a third circuit coupled to the second circuit in a current mirror configuration and coupled to receive the first and second voltage supplies, the third circuit including a second fuse and a second output node coupled to the third circuit to indicate a state of the second fuse.

9. The fuse sensing circuit of claim 8 wherein the potential of the second output node is within the first range if the second fuse is un-programmed and within the second range if the second fuse is programmed.

10. The fuse sensing circuit of claim 8 wherein one of the first and second fuses is programmed and the other of the first and second fuses is unprogrammed, the state of the first fuse being identified by comparing the potential on the first output node to the potential on the second output node.

11. The fuse sensing circuit of claim 1 further including a storage device for storing the state of the first fuse.

12. A fuse sensing circuit comprising:
 a current mirror including two circuit branches coupled in a current mirror configuration, the current mirror coupled between first and second voltage supplies;
 a first fuse coupled between a first branch of the two circuit branches of the current mirror and the first voltage supply;
 a reference resistance coupled between a second branch of the two circuit branches and the first voltage supply;
 a first output node coupled to the first branch, a potential on the first output node indicating that the first fuse is un-programmed if the potential is within a first range, the potential indicating that the first fuse is programmed if the potential is within a second range; and
 first and second margin test devices coupled to the first branch and coupled to the second voltage supply, each of the first and second margin test devices changing the potential on the output node when enabled to indicate that the first fuse is marginal if the changed potential is outside of the first and second ranges.

13. The fuse sensing circuit of claim 12 wherein the reference resistance comprises one or more fuses in series, the one or more fuses being matched lithographically and in material to the first fuse.

14. The fuse sensing circuit of claim 12 further including a third circuit branch coupled to the second branch of the to current mirror in a current mirror configuration and coupled between the first and second voltage supplies, the third circuit branch including a second fuse and a second output node, a potential on the second output node indicating a state of the second fuse, the potential on the second output node being within a third range if the second fuse is un-programmed or within a fourth range if the second fuse is programmed.

15. The fuse sensing circuit of claim 12 further including sense enable circuitry coupled to the current mirror, the sense enable circuitry responsive to a sense enable signal to turn on the current mirror to enable the fuse sensing circuit to sense the state of the first fuse.

16. A fuse sensing circuit for sensing a state of at least a first fuse, the fuse sensing circuit comprising:
 a first circuit including a first fuse having one terminal coupled to a first supply voltage and an opposite terminal coupled to a first terminal of a first sensing transistor, a second terminal of the first sensing transistor coupled to a second supply voltage;
 a second circuit including a reference resistance coupled to the first supply voltage and to a first terminal of a second sensing transistor, a second terminal of the second sensing transistor coupled to the second supply voltage, the first and second sensing transistors being coupled in a current mirror configuration;
 a first output node coupled to the second terminal of the first sensing transistor to indicate the state of the first fuse by a sensed potential, the sensed potential on the first output node being within a first range if the first fuse is un-programmed, the sensed potential being within a second range if the first fuse is programmed; and
 a first margin test device having one terminal coupled to the second terminal of the first sensing transistor, the first margin test device changing the sensed potential on the first output node when the first margin test device is turned on such that the first fuse is identified as being marginally un-programmed if the changed potential is outside the first range and the sensed potential is within the first range.

17. The fuse sensing circuit of claim 16 further including a second margin test device having one terminal coupled to the second terminal of the second sensing transistor, the second margin test device changing the sensed potential on the first output node when the second margin test device is turned on such that the first fuse is identified as being marginally programmed if the changed potential is outside the second range and the sensed potential is within the second range.

18. The fuse sensing circuit of claim 16 wherein the first circuit further includes a first sense enable transistor coupled between the second terminal of the first sensing transistor and the second supply voltage and the second circuit further includes a second sense enable transistor coupled between the second terminal of the second sensing transistor and the second supply voltage, the first and second sense enable transistors being responsive to a sense enable signal to disable the fuse sensing circuit.

19. The fuse sensing circuit of claim 16 wherein the first circuit further includes a first load device coupled between the second terminal of the first sensing transistor and the second supply voltage and the second circuit further includes a second load device coupled between the second terminal of the second sensing transistor and the second supply voltage, the first and second load devices being matched in layout and materials.

20. The fuse sensing circuit of claim 16 wherein corresponding devices in the first and second circuits are matched in layout and materials.

21. The fuse sensing circuit of claim 16 wherein the reference resistance comprises one or more fuses in series, the one or more fuses being matched lithographically and in material to the first fuse.

22. The fuse sensing circuit of claim 16 further including:
 a third circuit including a second fuse having one terminal coupled to the first supply voltage and an opposite terminal coupled to a first terminal of a third sensing transistor, a second terminal of the third sensing transistor coupled to the second supply voltage, and
 a second output node coupled to the second terminal of the third sensing transistor to indicate a state of the second fuse by a sensed potential, the sensed potential on the second output node being within a third range if the second fuse is un-programmed, the sensed potential being within a fourth range if the second fuse is programmed.

23. The fuse sensing circuit of claim 18 further including a storage device to store the state of the first fuse, the storage device including:

a first NAND gate having a first input coupled to the first output node indicating the state of the first fuse and a second input coupled to receive the sense enable signal, an inverter coupled to the first output node, a second NAND gate having a first input coupled to an output of the inverter communicating an inverted state of the first fuse, and a second input coupled to receive the sense enable signal, and a latch device to latch the state of the first fuse in response to the sense enable signal being asserted, the latch device receiving the outputs of the first and second NAND gates to latch the state of the first fuse.

24. The fuse sensing circuit of claim 16 wherein the reference resistance comprises a section of fuse material.

* * * * *